United States Patent [19]
Nishizawa et al.

[11] Patent Number: 5,250,148
[45] Date of Patent: Oct. 5, 1993

[54] PROCESS FOR GROWING GAAS MONOCRYSTAL FILM

[75] Inventors: Junichi Nishizawa; Hitoshi Abe, both of Sendai, Japan

[73] Assignee: Research Development Corporation, Tokyo, Japan

[21] Appl. No.: 790,118

[22] Filed: Nov. 12, 1991

Related U.S. Application Data

[63] Continuation of Ser. No. 423,595, Oct. 17, 1989, abandoned, which is a continuation of Ser. No. 863,280, May 15, 1986, abandoned.

[30] Foreign Application Priority Data

May 15, 1985 [JP] Japan .................. 60-101379

[51] Int. Cl.$^5$ .................................. C30B 25/14
[52] U.S. Cl. ........................ 156/611; 156/610; 156/DIG. 70; 156/DIG. 81; 156/DIG. 113
[58] Field of Search ............. 156/610, 611, 613, 614, 156/DIG. 70, DIG. 81, DIG. 113; 148/DIG. 56, DIG. 110; 437/236

[56] References Cited

U.S. PATENT DOCUMENTS

| | | | |
|---|---|---|---|
| 3,293,074 | 12/1966 | Nickl | 148/DIG. 56 |
| 3,802,967 | 4/1974 | Ladany et al. | 252/62.36 A |
| 4,058,430 | 11/1977 | Suntola et al. | 156/611 |
| 4,086,109 | 4/1978 | Hallais | 156/613 |
| 4,159,919 | 7/1979 | McFee et al. | 156/DIG. 70 |
| 4,190,470 | 2/1980 | Walline | 156/611 |
| 4,533,410 | 8/1985 | Ogura et al. | 156/614 |
| 4,806,321 | 2/1989 | Nishizawa et al. (I) | 156/613 |
| 4,834,831 | 5/1989 | Nishizawa et al. (II) | 156/613 |
| 4,861,417 | 8/1989 | Mochizuki et al. | 156/611 |

FOREIGN PATENT DOCUMENTS 1000882 6/1974 Japan .................. 156/610

OTHER PUBLICATIONS

Fraas, "A New Low Temperature III-V Multi Layer Growth Technique", Journal of Applied Physics 52(11) Nov. 1981, pp. 6939-6943.

Smith, "Epitoxial Growth of GaAs by Low Pressure MOCVD", Journal of Crystal Growth, vol. 67 (1984), pp. 573-578.

Primary Examiner—Robert Kunemund
Attorney, Agent, or Firm—Armstrong, Westerman, Hattori, McLeland & Naughton

[57] ABSTRACT

A GaAs monocrystal film was grown by use of a process which comprises introducing a gaseous compound containing a component element desired to be grown into a vacuum tank, and submitting the compound to reaction on a base to thereby grow a semiconductor crystal each one molecular layer.

Triethylgallium (TEG) and arsine (AsH$_3$) are used as the gaseous compound. One gas is introduced into the vaccum tank and then discharged after the passage of a predetermined time, and the other gas is introduced thereinto and then discharged after the passage of a predetermined time whereby a crystal for one molecular layer grows.

By use of TEG as a gallium source, reaction progresses even when a temperature of the base is below 300° C., and a GaAs monocrystal film which is extremely less in lattice failure and impurities was obtained.

5 Claims, 5 Drawing Sheets

PROCESS FOR GROWING GAAS MONOCRYSTAL FILM

This application is a continuation of application Ser. No. 423,595, filed Oct. 17, 1989 which is a continuation of application Ser. No. 863,280 filed May 15, 1986, both now abandoned.

BACKGROUND OF THE INVENTION

1. Field of the Invention

The present invention relates to a process for growing a GaAs monocrystal film suitable for forming a monocrystal growing layer of GaAs in the order of a single molecular layer.

2. Description of the Prior Art

In the past, as a gas phase epitaxy technique for obtaining a film crystal of a semiconductor, an organic metal gas-phase growing process (hereinafter called "MO-CVD process")and a molecular beam epitaxy process (hereinafter called "MBE process") have been known. However, where a compound semiconductor between III-group to V-group as in GaAs is grown by the MOCVD process, III-group and V-group elements as a source with a hydrogen gas as a carrier are simultaneously introduce for growth thereof by thermal cracking, and therefore the grown layer is poor in quality. There is a further disadvantage in that the order of the single molecular layer is difficult to control.

On the other hand, the MBE process well known as a crystal growing process which utilizes a super-high vacuum employs physical adsorption as a first stage, and therefore, the quality of crystal obtained thereby is inferior to the gas-phase growing process which utilizes chemical reaction. When a compound semiconductor between III-group - V-group as in GaAs is grown, IIIgroup and V-group elements are used as a source, the source itself being installed within a growing chamber. Because of this, controlling the emitted gas obtained by heating the source and the amount of vaporization, and supplying the source are difficult to do, and it is difficult to maintain the growth rate constant for a long period of time. Furthermore, a vacuum device such as discharge of vaporized material becomes complicated. Moreover, it is difficult to precisely control the stoichiometry of the compound semiconductor, and after all, there poses a disadvantage in that a crystal of high quality may not be obtained.

In view of the foregoing, the present inventors have previously proposed a semiconductor crystal growing process having a controllability of a grown film layer of the single molecular layer order (see Japanese Patent Application Nos. 153977/1984 and 153978/1984 Specifications). This will be explained with reference to FIG. 5.

In FIG. 5, reference numeral 1 designates a growth chamber, which is formed of metal such as stainless steel; 2, a gate valve; 3, an exhaust chamber for making the growth chamber 1 super-high vacuum; 4, 5, nozzles for introducing gaseous compounds of component elements of III-group and V-group of III-group - V-group compound semiconductors, for example; 6, 7, valves for opening and closing the nozzles 4, 5; 8, a gaseous compound containing a component element of III-group; 9, a gaseous compound containing a component element of V-group; and 10, a heater for heating the base, which is a tungsten (W) wire with quartz glass sealed therein, the wire or the like not shown. Reference numeral 11 designates a thermocouple for measuring the temperature; 12, a base for a compound semiconductor; and 13, a pressure gauge for measuring vacuum within the growth chamber.

The process for the epitaxial growth of GaAs molecular layers one by one on the base 12 is accomplished in the following procedure. That is, the e 2 is opened, and the interior of the growth chamber is evacuated to the extent of $10^{-7}$ to $10^{-8}$ Pascal (hereinafter merely indicated at Pa) by the superhigh vacuum evacuation device 3. Next, the GaAs base 12 is heated by means of the heater 10 to the extent of 300° to 800° C., and the valve 6 is opened to introduce TMG (trimethylgallium) 8 as a gas containing Ga into the tank for 0.5 to 10 seconds in the range that pressure within the growth chamber is from $10^{-1}$ to $10^{-7}$ Pa. Thereafter, after the valve 6 is closed to evacuate the gas within the growth chamber 1, the valve 7 is opened to introduce AsH$_3$ (arsine) 9 as a gas containing As into the chamber for 2 to 200 seconds in the range that pressure is $10^{-1}$ to 10 Pa. Thereby, at least one molecular layer of GaAs may be grown on the base 12. The aforementioned steps of operation are repeated to successively grow single molecular layers, whereby the epitaxial grown layer of GaAs having the desired thickness may be grown with accuracy of a single molecular layer.

Incidentally, when in the process of crystal growth, the temperature of the crystal growth is increased, vacancies, atoms between lattices and the like are to present. In addition, impurities become taken in due to autodoping or the like, which is not preferable in view of growing crystals of high completeness. To avoid this, it is necessary to grow crystals without increasing the temperature. However, according to the previously proposed crystal growing process, the crystal growing temperature is relatively high, from 300° to 800° C., thus failing to obtain a single crystal of GaAs having a high completeness.

SUMMARY OF THE INVENTION

It is an object of the present invention to provide a process for growing a GaAs semiconductor monocrystal film having a high quality in the order of a single molecular layer, while overcoming the abovedescribed problems.

According to the present invention, the processes previously proposed by the present inventors are further developed so that TEG and AsH$_3$ are used as a source gas whereby they may be alternately introduced into the growth chamber under a predetermined pressure for a predetermined period of time to thereby obtain a highly pure GaAs monocrystal film at a low temperature below 300° C.

DETAILED DESCRIPTION OF THE PREFERRED EMBODIMENTS

One embodiment of the present invention will be described hereinafter.

Figure 1:
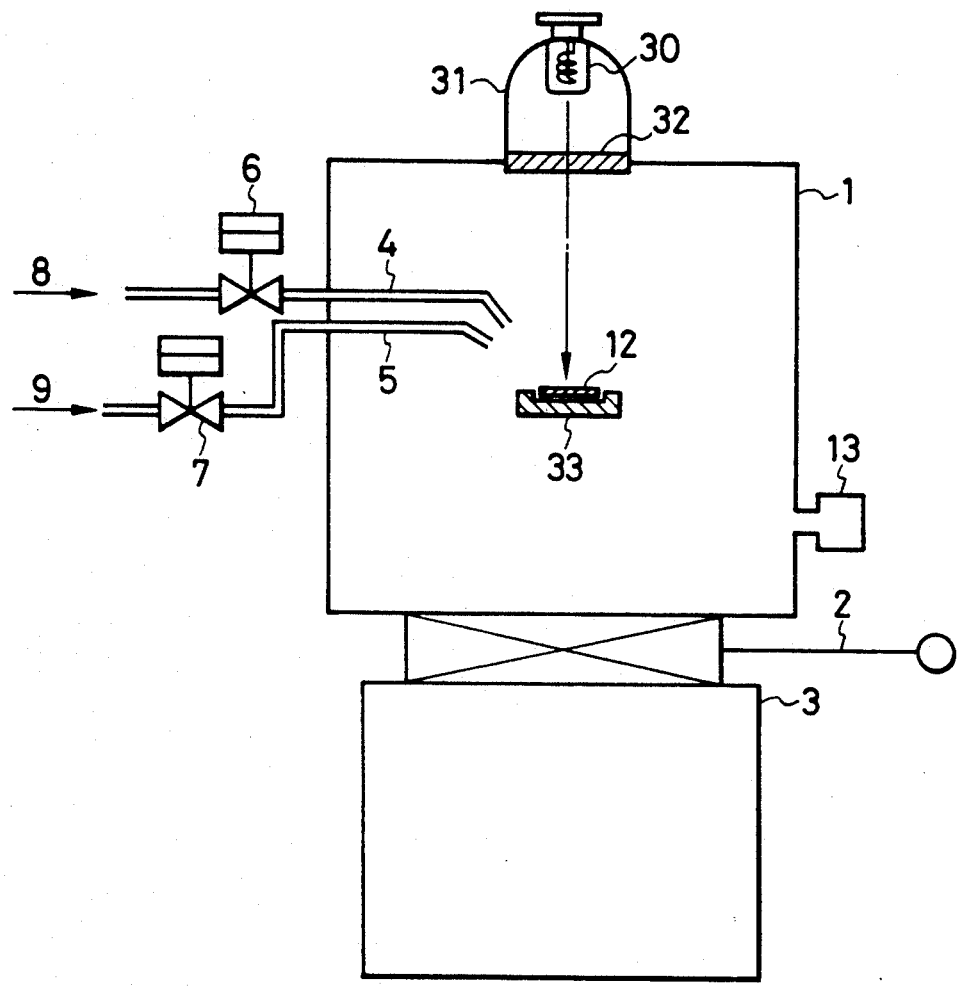
FIG. 1 is a structural view of a crystal growing apparatus according to one embodiment of the present invention.
Figure 5:
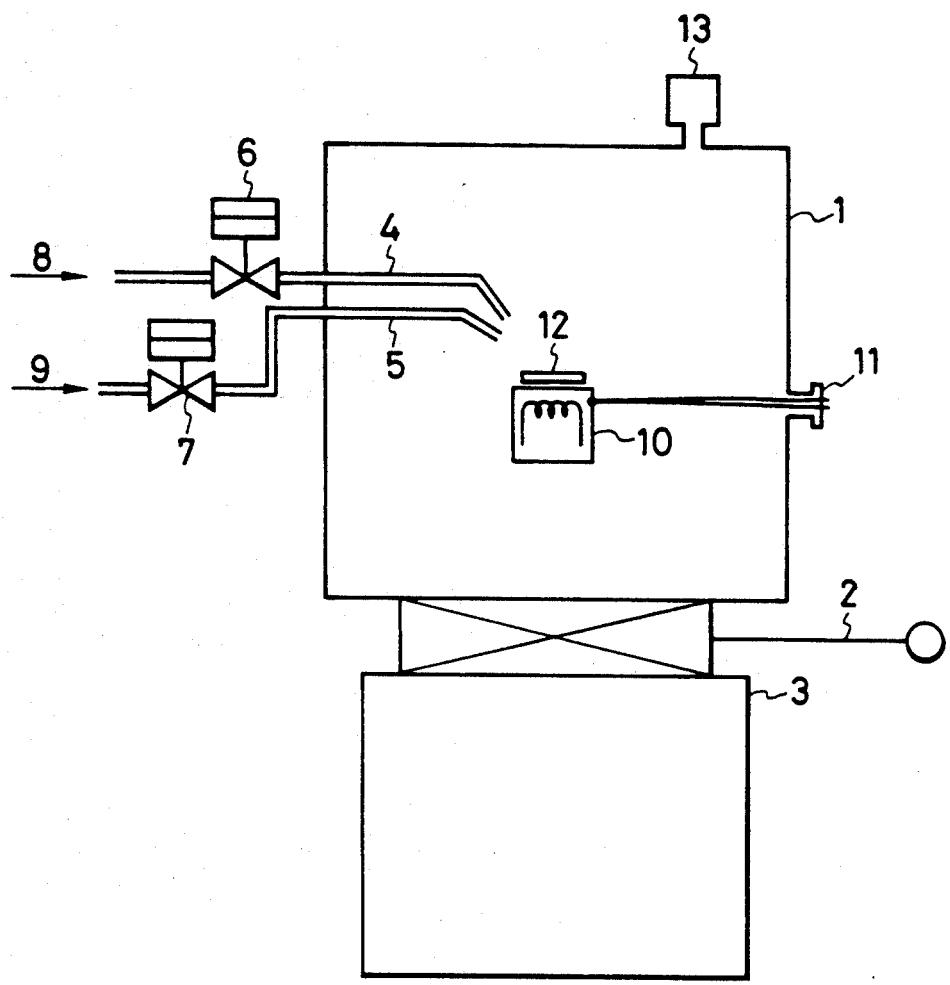
FIG. 5 is a structural view of a crystal growing apparatus previously proposed by the present inventors.

FIG. 1 shows the structure of a molecular layer epitaxial growing apparatus according to one embodiment of the present invention. The same reference numerals in FIG. 1 as those of FIG. 5 indicate the same or corresponding parts in FIG. 5 with the exception that an infrared lamp 30 is used as a heating source, the lamp being provided within a lamp house 31 externally of a growth chamber 1, and infrared rays emitted from the lamp house 31 are irradiated on a base 12 through a quartz glass 32 to heat the base 12 held by a susceptor 33.

This apparatus is used, and TEG (triethylgallium) 6 as a gas containing Ga is introduced under pressure of $10^{-5}$ to $10^{-2}$ Pa for 1 to 20 seconds and evacuated for 1 to 20 seconds. Then, AsH$_3$ (arsine) 9 as a gas containing As is introduced under pressure of $10^{-4}$ to 1 Pa for 1 to 200 seconds and then evacuated for 1 to 20 seconds. Thereby, a single molecular layer of GaAs may be grown on the base 12. The above-described steps of operation are repeated to successively grow single molecular layers whereby a monocrystal grown film of GaAs having a desired thickness may be grown with accuracy of the single molecular layer.

Figure 2:
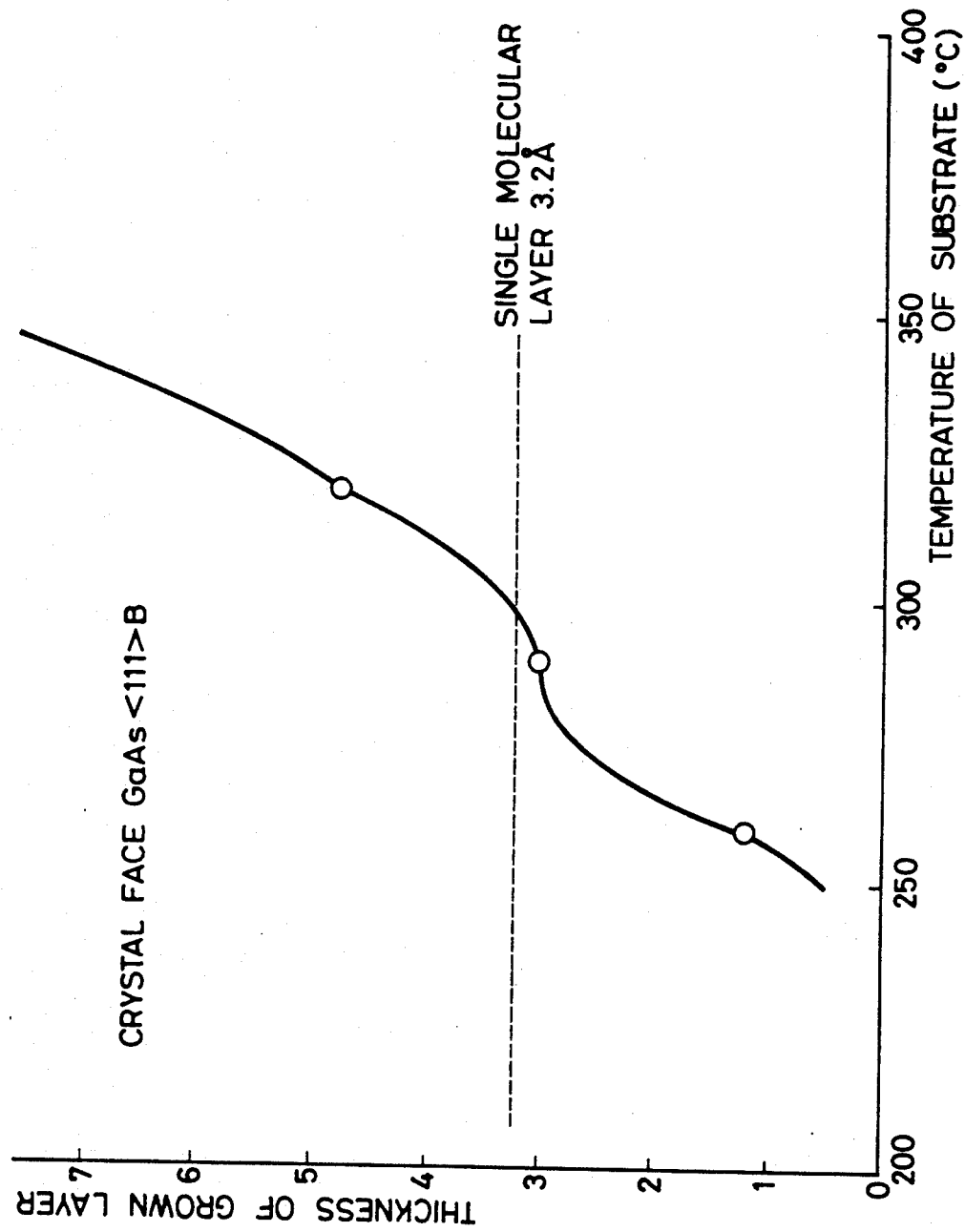
FIG. 2 is a graphic representation showing the relationship between the grown film thickness of a crystal manufactured by use of the apparatus shown in FIG. 1 and the temperature of the base.

FIG. 2 shows a grown film thickness in a direction of <111> B face of GaAs film per cycle at a temperature from 260° C. to 350° C. with a temperature of the base as a parameter, in which case TEG and AsH$_3$ are used as an introducing gas. When the base temperature is 290° C., the GaAs film per cycle was 3.2 Å corresponding to one molecular layer. The growth temperature of the aforesaid 260° C. is a temperature lower by about 90° C. than the minimum crystal growth temperature of 350° C. in the crystal growing process relied upon a combination of TMG and AsH$_3$ previously proposed by the present inventors.

Figure 3:
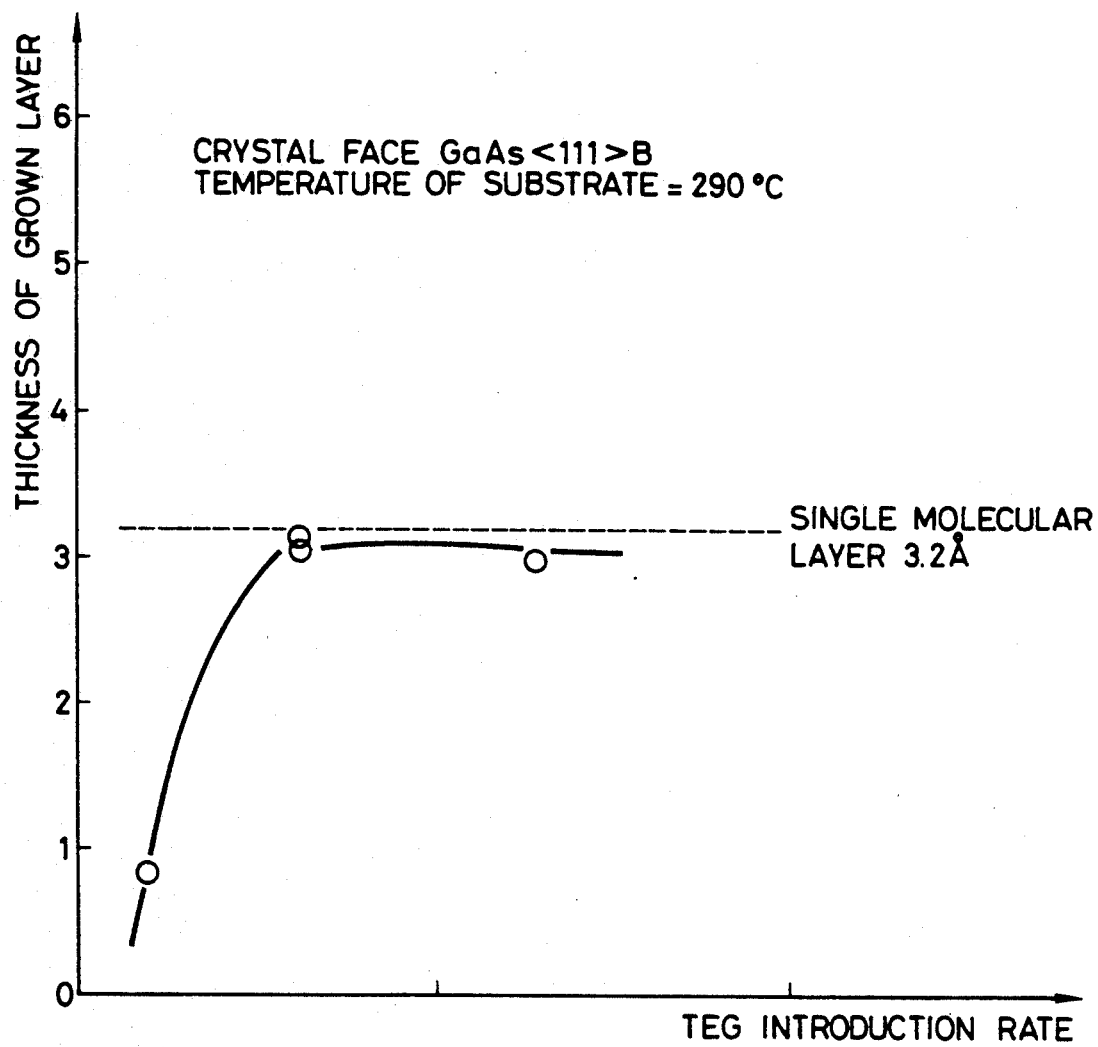
FIG. 3 is a graphic representation showing the relationship between the grown film thickness and the amount of introduction of TEG when the base temperature is 290° C.

FIG. 3 shows a grown film thickness of GaAs per cycle, where the base temperature is 290° C., gas introducing pressure is $10^{-1}$ to $10^{-4}$ Pa, introducing time is 2 to 60 seconds, and evacuation time is 2 to 20 seconds, the amount of introduction of TEG per cycle being as a parameter. As can be understood from FIG. 3, when the amount of TEG introduction per cycle increases, the grown film thickness becomes saturated. Accordingly, if the growing is made with the amount of gas introduction in excess of the saturated value, even if the amount of gas introduction should be slightly varied, the growth of one molecular layer per cycle would be obtained positively. Therefore, the film thickness can be controlled with the accuracy of atom unit. The epitaxially grown layer of the thus obtained GaAs was examined by electron beam diffraction and X-ray diffraction, as the result of which was found that the layer was a film monocrystal having an extremely high completeness.

Figure 4:
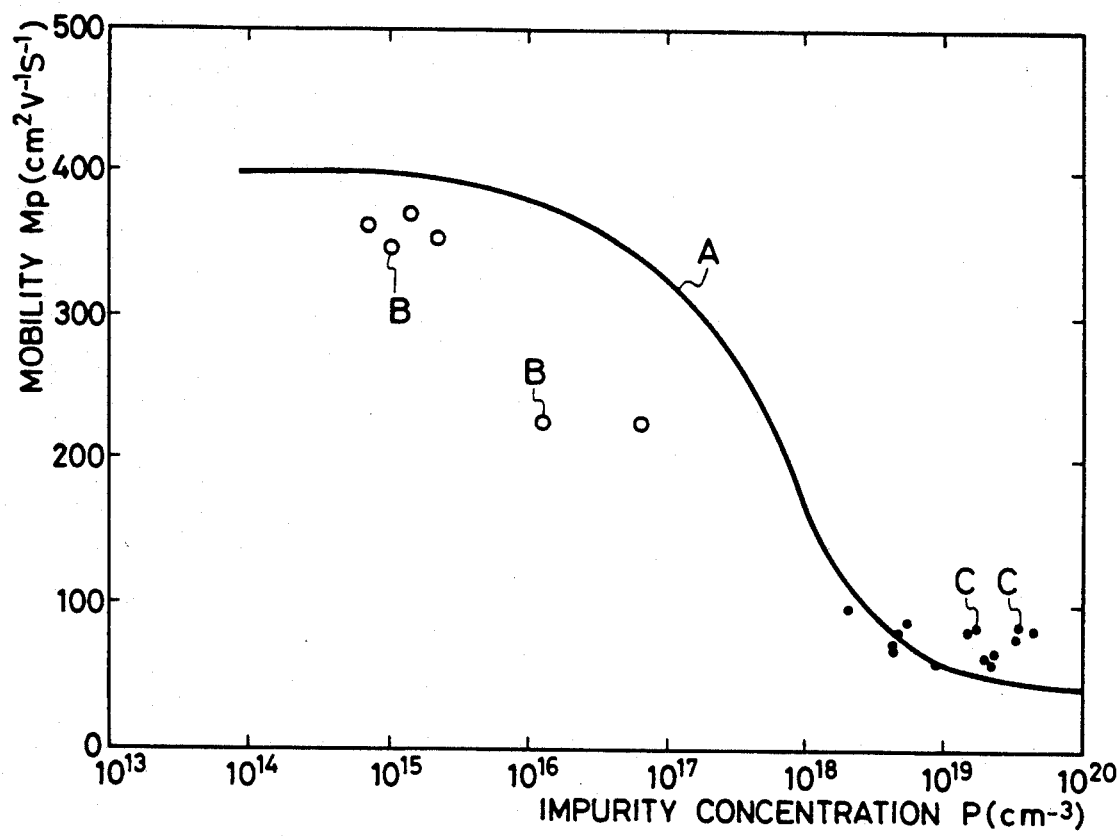
FIG. 4 is a graphic representation showing the relationship between the density of impurities of the grown film with TEG and AsH$_3$ as the source gas and the mobility as compared with a conventional molecular layer epitaxial (MLE) film.

FIG. 4 shows the relationship between the density of impurities of a film submitted to the molecular layer epitaxial growing with TEG and AsH$_3$ as a source gas and the mobility as compared with a conventional molecular layer expitaxial grown film formed from TMG and AsH$_3$. In FIG. 4, the curve indicated at A is a theoretically calculated value, the point indicated at B is a grown film with TEG and AsH$_3$ as a source, and the point indicated at C is a conventional molecular layer epitaxial growth chamber. As can be understood from this figure, in prior art, the density of impurities was high, $10^{18}$ to $10^{20}$ cm$^{-3}$, and the mobility was less than 100 cm$^2$V$^{-1}$S$^{-1}$, whereas in the present invention, the density of impurities was improved by 2 to 3 orders, i.e. $10^{15}$ to $10^{17}$ cm$^{-3}$, and the mobility was a value close to the theoretical value, i.e., 360 cm$^2$V$^{-1}$S$^{-1}$. The thus obtained grown film was prepared under the experimental conditions such that pressure of TEG is $10^{-3}$ to $10^{-4}$ Pa, pressure of AsH is $10^{-1}$ to $10^{-2}$ Pa, introduction time is between 2 and 60 seconds, and evacuation time is 2 to 20 seconds. It may be understood from FIG. 4 that the grown film according to the present invention is a particularly excellent high-purity monocrystal as compared with that obtained by the conventional molecular layer epitaxial growth.

The density of impurities of thus obtained crystal was less than $10^{15}$ cm$^{-3}$ and the mobility was above 360 cm$^2$V$^{-1}$S$^{-1}$.

As described above, according to the present invention, crystals may be grown monolayer by monolayer, the stoichiometry can be easily fulfilled, and the substrate throughout temperature is low. Therefore, it is possible to form a monocrystal having a good quality with a minimum lattice failure on the base.

Moreover, addition of impurities may be made one by one in layer, and therefore, an extremely sharp density distribution of impurities may be obtained, thus exhibiting excellent operation and effect in the manufacture of extremely high-speed transistors, integrated circuits, diode light emitting elements and the like.

What is claimed is:

1. A method for growing a GaAs single crystal film on a base plate by introducing gases containing a crystal component element into a growing vessel evacuated to a vacuum from the outside, the method comprising evacuating said growing vessel to a predetermined pressure of $10^{-7}$ to $10^{-8}$ Pascals while introducing triethyl gallium (TEG) into said growing vessel for a 0.5 to 10 seconds under a pressure of $10^{-1}$ to $10^{-7}$ Pa, evacuating said vessel, introducing arsine (AsH$_3$) into said growing vessel for 2 to 200 seconds under a pressure of $10^{-1}$ to $10^{-7}$ Pa to thereby repeat a cycle for growing at least substantially one molecular layer, and thereby growing a GaAs single crystal film of a desired thickness, without the presence of carbon, with the accuracy of a single molecular layer.

2. The process as set forth in claim 1, wherein a heating source comprises an infrared lamp provided externally of the growing tank.

3. The process as set forth in claim 1, wherein the GaAs layer obtained has a (111) B crystal surface.

4. A process according to claim 1, wherein each of said monocrystalline GaAs film layers is less than 3.2 Å.

5. A process according to claim 1, wherein said GaAs film has an impurity density, undoped, of $10^{17}$ cm$^{-3}$ or less.

* * * * *

UNITED STATES PATENT AND TRADEMARK OFFICE
CERTIFICATE OF CORRECTION

PATENT NO. : 5,250,148
DATED : October 5, 1993
INVENTOR(S) : Nishizawa, et. al.

It is certified that error appears in the above-indentified patent and that said Letters Patent is hereby corrected as shown below:

On the cover page, Item [73] should read: --Research Development Corporation, Tokyo, Japan, Junichi Nishizawa, Sendai, Japan, and Oki Electric Industry Co., Ltd., Tokyo, Japan--.

Signed and Sealed this

Second Day of January, 1996

*Attest:*

BRUCE LEHMAN

*Attesting Officer*     *Commissioner of Patents and Trademarks*